(12) United States Patent
Matsushita et al.

(10) Patent No.: US 6,605,999 B2
(45) Date of Patent: Aug. 12, 2003

(54) HIGH-FREQUENCY POWER AMPLIFIER, WIRELESS COMMUNICATION APPARATUS AND WIRELESS COMMUNICATION SYSTEM

(75) Inventors: Kouichi Matsushita, Komoro (JP); Tomio Furuya, Sawa (JP); Tetsuaki Adachi, Chisagata (JP); Hitoshi Akamine, Maebashi (JP); Nobuhiro Matsudaira, Chigasaki (JP)

(73) Assignees: Hitachi, Ltd., Tokyo (JP); Hitachi Communication Systems, Inc., Kanagawa (JP)

( * ) Notice: Subject to any disclaimer, the term of this patent is extended or adjusted under 35 U.S.C. 154(b) by 0 days.

(21) Appl. No.: 09/984,800

(22) Filed: Oct. 31, 2001

(65) Prior Publication Data

US 2002/0057131 A1 May 16, 2002

(30) Foreign Application Priority Data

Nov. 15, 2000 (JP) ........................................ 2000-347853

(51) Int. Cl.[7] ................................................. H03F 3/30
(52) U.S. Cl. ........................................ 330/285; 330/133
(58) Field of Search ................................ 330/133, 134, 330/279, 285; 455/126

(56) References Cited

U.S. PATENT DOCUMENTS

| | | | |
|---|---|---|---|
| 5,994,963 A | 11/1999 | Kawai et al. ................ 330/277 |
| 6,172,567 B1 * | 1/2001 | Ueno et al. .............. 330/133 X |
| 6,259,901 B1 * | 7/2001 | Shinomiya et al. ...... 430/133 X |

OTHER PUBLICATIONS

L. Goldberg, "RF Power Amplifier IC Serves to Extend Options at Output Stage of Cellular Phone", *Nikkei Electronics*, No. 681, Jan. 27, 1997, pp. 115–126 (with English translation).
T. Endo et al. "A High Frequency Analog Signal Processing IC for the 'GSM/EGSM' Digital Cellular Standards", *Hitachi Review*, vol. 79, No. 11, 1997, pp. 63–68 (with English translation).

* cited by examiner

*Primary Examiner*—Steven J. Mottola
(74) *Attorney, Agent, or Firm*—Miles & Stockbridge P.C.

(57) ABSTRACT

A wireless communication apparatus, which is designed to control the output power without using the power control signal sent from the base station, comprises a high-frequency power amplifier for transmission, a detection means which measures the output power of the power amplifier, and an automatic power control circuit which controls the output power of the power amplifier based on information provided by the detection means. The power amplifier includes an amplifying system which has multiple amplifying stages and is connected between the input and output terminals, and bias circuits which supply bias voltages to transistors of the respective amplifying stages. The bias circuits, which supply the bias voltages to the multiple amplifying stages excluding the last amplifying stage, are each made up of multiple resistors. Each of these bias circuits divides with the resistors the voltage of the entered power control signal to produce a bias voltage, which has a linear response to the control signal for low-power mode, to be fed to the control terminal of the amplifying stage. The bias circuit which supplies a bias voltage to the last amplifying stage includes a circuit which produces a bias voltage which has a nonlinear response to the control signal for high-power mode.

47 Claims, 12 Drawing Sheets

HIGH-FREQUENCY POWER AMPLIFIER, WIRELESS COMMUNICATION APPARATUS AND WIRELESS COMMUNICATION SYSTEM

BACKGROUND OF THE INVENTION

The present invention relates to a high-frequency power amplifier (high-frequency circuit module), a wireless communication apparatus which incorporates the high-frequency circuit module, and a wireless communication system, and particularly to a wireless communication technique for controlling the output power of a high-frequency power amplifier accurately thereby to perform the communication with a stable output power.

Wireless communication apparatus for mobile telephone and portable telephone incorporate in their transmission output stage a power amplifier formed of MOSFETs (Metal Oxide Semiconductor Field Effect Transistors) and GaAs-MES (Metal Semiconductor) FETs in cascade connection.

Portable telephone (portable terminal) systems have been generally designed such that each portable unit varies the output power to match with the communication environment in response to the power control signal sent from the base station thereby to prevent crosstalk with other units.

Trends of high-frequency power amplifiers are described in publication "Nikkei Electronics", pp. 115–126, published by Nikkei BP Corp. on Jan. 27, 1997. The article of this publication covers the standard scheme of the 900 MHz cellular portable telephone in North America and the GSM (Global System for Mobile Communications) in Europe.

Another publication "Hitachi Review", Vol.79, No.11 (1997), pp.63–68, published by Hitachi Review Corp. includes an article on the high-frequency analog signal processor IC for the digital cellular GSM/EGSM. This publication discloses by block diagram a control scheme of a power amplifier module based on a detected power signal provided by a directional coupler.

SUMMARY OF THE INVENTION

In a digital portable telephone system (cellular telephone system) as shown in FIG. 17, a base station 1 sends a power control signal from its antenna 2 to each mobile terminal unit (portable telephone unit) 3 having an antenna 4 so that the unit operates at a minimal transmission power necessary for communication, thereby to prevent crosstalk with other units. The power control signal is either a high-level power signal 5 or a low-level power signal 6.

The mobile terminal unit includes an automatic power control (APC) circuit, which operates in response to the received power control signal to adjust the output power by varying a power control signal Vapc to be fed to the control terminal of the high-frequency power amplifier of the transmission output stage.

The portable telephone unit is required to have a high output gain and efficiency and, at the same time, a low power consumption at the time of small-power operation. It is difficult to meet these requirements in the entire output power range, and therefore the high-frequency power amplifier is currently designed to switch in its response characteristics between low-power mode and high-power mode across a border power level of about 29 dBm, thereby accomplishing lower power consumption during small-power operation and higher operational efficiency.

FIG. 18 and FIG. 19 show the circuit arrangement of a 3-stage high-frequency power amplifier including three transistors (MOSFETs: Metal Oxide Semiconductor Field Effect Transistors) in cascade connection. The first-stage transistor (1stTr), second-stage transistor (2ndTr) and third-stage transistor (3rdTr) are all n-channel NMOS transistors.

The power amplifier receives a high-frequency input signal RFin on its input terminal 10, which is connected to the gate electrode of the transistor 1stTr via a coupling capacitor C10. The 1stTr has its drain electrode as output terminal connected via a coupling capacitor C11 to the gate electrode of the 2ndTr, with the drain electrode as output terminal thereof being connected via a coupling capacitor C12 to the gate electrode of the 3rdTr (last-stage transistor), with the drain electrode thereof being connected to an output terminal 11, which releases a high-frequency output signal RFout.

The power amplifier receives on its control terminal 12 a power control signal Vapc, which is delivered to the gate electrodes as control electrodes of the transistors (1stTr, 2ndTr and 3rdTr). The 1stTr has its gate electrode biased by the voltage of power control signal Vapc with the rendition of voltage division by resistors R1 and R2, and the 2ndTr has its gate electrode biased by the voltage of Vapc with the rendition of voltage division by resistors R3 and R4.

The 3rdTr has its gate electrode biased by the voltage of Vapc with the rendition of voltage division by resistors R5 and R6 having resistance values of 10 k* and 30 k*, respectively, for example, and the further rendition of control by two transistors Q11 and Q12. The transistor Q11 has its drain electrode connected to the resistor R6 and its source electrode grounded, and operates for switching. The transistor Q12 has its gate electrode connected to the drain electrode of the Q11, its drain electrode connected to the gate electrode of the 3rdTr, and its source electrode grounded (connected to GND).

The transistors (1stTr,2ndTr and 3rdTr) have their drain electrodes connected to a first reference voltage terminal (power voltage terminal) 13 and supplied with a power voltage Vdd.

When the terminal unit 3 receives a high-level power signal from the base station 1, the signal turns on the transistor Q11, causing the transistor Q12 to have its gate electrode pulled to GND. Consequently, the 3rdTr operates to have a linear high-mode response as shown in FIG. 2.

In contrast, a low-level power signal from the base station 1 does not turn on the transistor Q11 and the transistor Q12 operates by having on its gate electrode the voltage of the voltage division node of the resistors R5 and R6. Consequently, the 3rdTr operates based on the nonlinear (saturated) low-mode response as shown in FIG. 2.

On the characteristic graph of FIG. 2, input voltage region A is of low-power mode selected by the low-level power signal, and input voltage region B is of high-power mode selected by the high-level power signal.

The inventors of the present invention have devised a bias circuit for making a transition of the 3rdTr gate voltage from the low-power mode to the high-power mode at a high-frequency power level of about 29 dBm, i.e., at a power control signal Vapc of about 1.25 V, and the present invention owes to this technique.

Accordingly, an object of this invention is to provide a high-frequency power amplifier and a wireless communication apparatus which are capable of selecting a high-power mode or low-power mode automatically without using the power control signal sent from the base station.

Another object of this invention is to provide a high-frequency power amplifier which is capable of controlling the output power characteristics accurately.

Still another object of this invention is to provide a wireless communication apparatus which is capable of controlling the output power characteristics accurately, thereby to perform stable communication.

These and other objects and novel features of the present invention will become more apparent from the following description taken in conjunction with the accompanying drawings.

Among the affairs of the present invention disclosed in this specification, representatives are briefed as follows.

(1) The inventive wireless communication apparatus comprises a high-frequency power amplifier for transmission, a detection means which measures the output power of the power amplifier, and a power control circuit (automatic power control circuit) which controls the output power of the power amplifier based on information provided by the detection means. The high-frequency power amplifier includes an amplifying system which has multiple amplifying stages and is connected between the input and output terminals, and bias circuits which supply bias voltages to transistors of the respective amplifying stages. The bias circuits, which supply bias voltages to the multiple amplifying stages excluding a first amplifying stage (last amplifying stage), are each made up of multiple resistors. Each of these bias circuits divides with the resistors the voltage of an entered power control signal to produce a bias voltage, which has a linear response to the control signal for low-power mode, to be fed to the control terminal of the amplifying stage. The bias circuit which supplies a bias voltage to the first amplifying stage (last amplifying stage) includes a circuit which produces a bias voltage which has a nonlinear response to the control signal for high-power mode.

The bias circuit for the last amplifying stage is made up of a voltage division circuit which divides the voltage of the power control signal and delivers the divided voltage to the control terminal of the last amplifying stage, and a control transistor having its control electrode connected to the voltage division node of the voltage division circuit, its first electrode connected to the resistor on the lower voltage side relative to the voltage division node among the resistors of the voltage division circuit, and its second electrode grounded.

In the inventive wireless communication system which avails for wireless communication among wireless communication units by way of a base station, the base station does not have a function of sending a power control signal, and each wireless communication unit has a means of controlling its power mode without using a remote power control signal. The power mode control means includes a bias circuit which supplies a bias voltage to the last amplifying stage of the high-frequency power amplifier.

The inventive wireless communication unit comprises:
a high-frequency power amplifier for transmission;
detection means for measuring the output power of the power amplifier; and
an automatic power control circuit which controls the output power of the power amplifier based on information provided by the detection means,
the power amplifier including:
an input terminal;
an output terminal;
a control terminal which receives a power control signal;
an amplifying system which has multiple amplifying stages and is connected between the input terminal and the output terminal; and
a bias circuit which is connected to the control terminal and adapted to supply a bias voltage, which has a nonlinear response to the power control signal received on the control terminal, to the last amplifying stage,
the bias circuit constituting the power mode control means.

(2) The bias circuit for the last amplifying stage in the above-mentioned item (1) comprises:
a voltage division circuit which divides with multiple resistors the voltage of a power control signal and delivers the divided voltage to the control terminal of the last amplifying stage;
a control transistor having its control electrode connected to the voltage division node of the voltage division circuit, its first electrode connected to the resistor on the lower voltage side relative to the voltage division node among the resistors of the voltage division circuit, and its second electrode grounded; and
a current sensing transistor having its control electrode connected to the control electrode of the transistor of the last amplifying stage and releasing a voltage indicative of the sensed current from its first electrode.

According to the above-mentioned arrangement of item (1), (a) The high-frequency power amplifier has its bias circuit for the transistor 3rdTr of the last amplifying stage adapted to switch the gate voltage characteristics from nonlinear response to linear response at a power control signal Vapc of about 1.2 V. This switching operation is equivalent to the switching from low-power mode to high-power mode in response to the power control signal sent from the base station.

(b) In consequence of item (a), the wireless communication unit does not need to have a processor for dealing with the power control signal from the base station and thus can reduce the number of component parts.

(c) In contrast to the conventional high-frequency power amplifier, in which the power mode switching circuit is formed by being monolithic on the semiconductor chip of the power amplifier, the inventive high-frequency power amplifier, which is rid of the reception of a power control signal (power mode control signal), does not need to include a switching transistor and associated input terminal (pad) on the semiconductor chip and thus can reduce the chip area.

(d) In consequence of item (c), the semiconductor chip for the high-frequency power amplifier can be made much smaller.

(e) In consequence of item (d), the number of semiconductor chips formed on a semiconductor wafer can be increased, the production yield can be improved, and the cost of semiconductor chips can be lowered.

(f) For a wireless communication system in which all portable telephone units are rid of remote power mode switching, the base station does not need to transmit a power control signal and can simplify the facility.

DESCRIPTION OF THE PREFERRED EMBODIMENTS

Embodiments of this invention will be explained in detail with reference to the drawings. Throughout the drawings, items having identical functions are referred to by same symbols, and explanation thereof will not be repeated.

Embodiment 1

FIG. 1 through FIG. 7 are diagrams-pertinent to the high-frequency power amplifier (high-frequency circuit module) and wireless communication apparatus based on the first embodiment of this invention. The high-frequency circuit module mentioned here is a module which includes at least a high-frequency power amplifier (PA).

The high-frequency circuit module (high-frequency power amplifier) is formed on a wiring board which is capped to have a thin rectangular solid structure (not shown). The module has external terminals extending on the rear surface toward the sides of the wiring board so as to be a surface-mounted device. The external terminals include an input terminal, output terminal, control terminal, first reference voltage terminal (power voltage terminal), and second reference voltage (ground: GND) terminal. Mounted on the wiring board is a semiconductor chip in which transistors are included, chip resistors and chip capacitors, which are connected to the external terminals by solder or wires.

The circuit module has a single amplifying system, or has multiple amplifying systems so as to be adapted to multiple communication systems. A circuit module including multiple amplifying systems or including additional functions has naturally an increased number of external terminals. The circuit module is incorporated in a wireless communication apparatus, e.g., portable telephone unit, portable terminal unit or mobile terminal unit, and used for a cellular telephone system.

Figure 1:
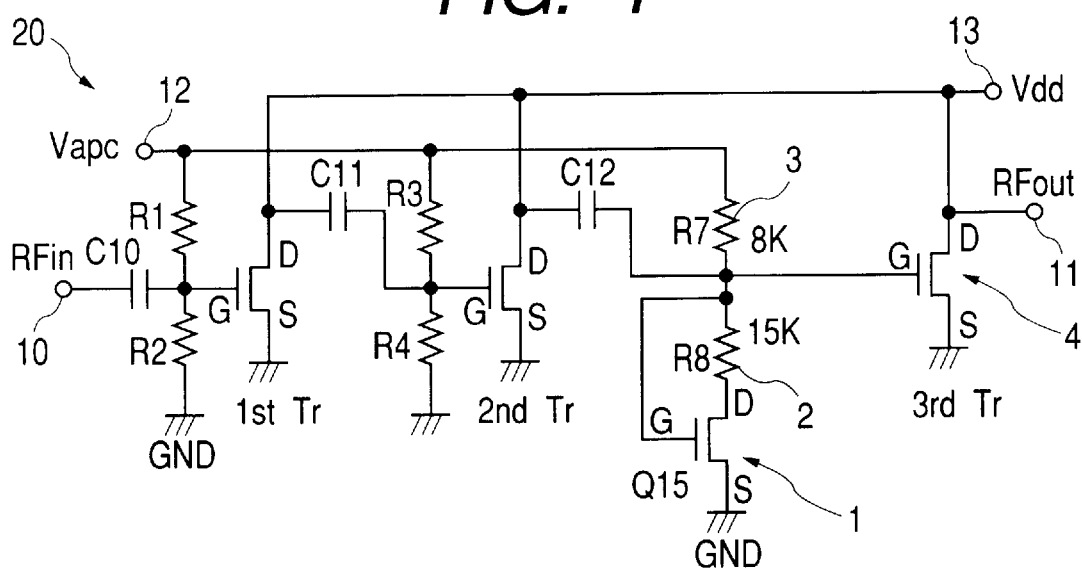
FIG. 1 is an equivalent circuit diagram of the high-frequency power amplifier based on a first embodiment of this invention.

FIG. 1 shows schematically the high-frequency power amplifier of this embodiment. The power amplifier 20 h as three amplifying stages by including three transistors (MOSFETs) in cascade connection. The first-stage transistor (1stTr), second-stage transistor (2ndTr) and third-stage transistor (3rdTr) are all n-channel NMOS transistors.

The power amplifier 20 receives a high-frequency input signal RFin on its input terminal 10, which is connected to the gate electrode of the transistor 1stTr via a coupling capacitor C10. The 1stTr has its drain electrode as output electrode connected via a coupling capacitor C11 to the gate electrode of the 2ndTr, with the drain electrode as output electrode thereof being connected via a coupling capacitor C12 to the gate electrode of the 3rdTr (last-stage transistor), with the drain electrode thereof being connected to an output terminal 11, which releases a high-frequency output signal RFout.

The power amplifier 20 receives on its control terminal 12 a power control signal Vapc, which is delivered to the gate electrodes as control electrodes of the transistors (1stTr, 2ndTr and 3rdTr). The 1stTr has its gate electrode biased by the voltage of power control signal Vapc with the rendition of voltage division by resistors R1 and R2, and the 2ndTr has its gate electrode biased by the voltage of Vapc with the rendition of voltage division by resistors R3 and R4.

The 3rdTr has its gate electrode biased by the voltage of Vapc with the rendition of voltage division by resistors R7 and R8 having resistance values of 8 k* and 15 k*, respectively, for example, and the further rendition of control by a transistor Q15. The transistor Q15 has its gate electrode connected to the voltage division node of the resistors R7 and R8, its drain electrode (first electrode) connected to the resistor R8, and its source electrode (second electrode) grounded (connected to GND).

The transistors (1stTr,2ndTr and 3rdTr) have their drain electrodes connected to a first reference voltage terminal (power voltage terminal) 13 and supplied with a power voltage Vdd.

Figure 2:
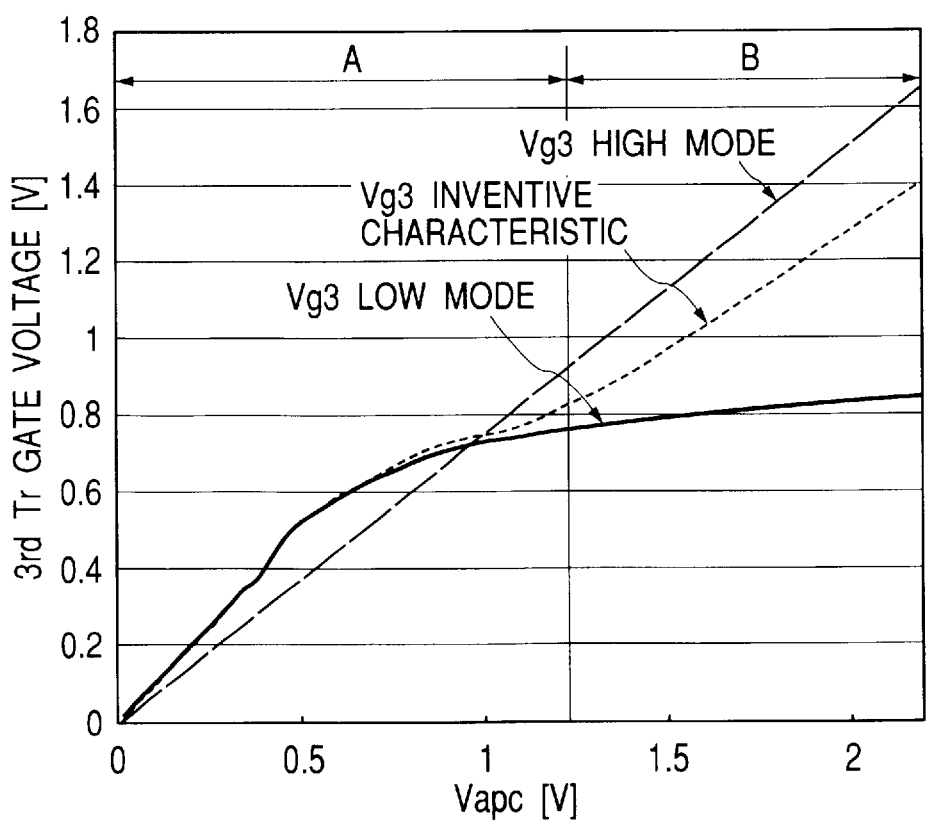
FIG. 2 is a graph showing the correlation between the power control signal Vapc and the gate voltage of transistor 3rdTr.

As shown in FIG. 2, the gate voltage of 3rdTr has the conventional low-mode characteristic in the range of power control signal Vapc up to about 1.1 V, it rises more sharply in the Vapc range above about 1.1 V, and it resembles the conventional high-mode characteristic while being lower by a certain voltage in the Vapc range above about 1.25 V.

Input voltage region A in FIG. 2 is of the gate voltage of the conventional low-power mode which would be selected by the power control signal sent from the base station to terminal units. However, the power amplifier 20 of this embodiment can deliver the output power of the low-power mode based on its bias circuit without using the power control signal sent from the base station. Also for input voltage region B, the power amplifier 20 can deliver the output power of the high-power mode based on its bias circuit without using the power control signal sent from the base station.

Figure 3:
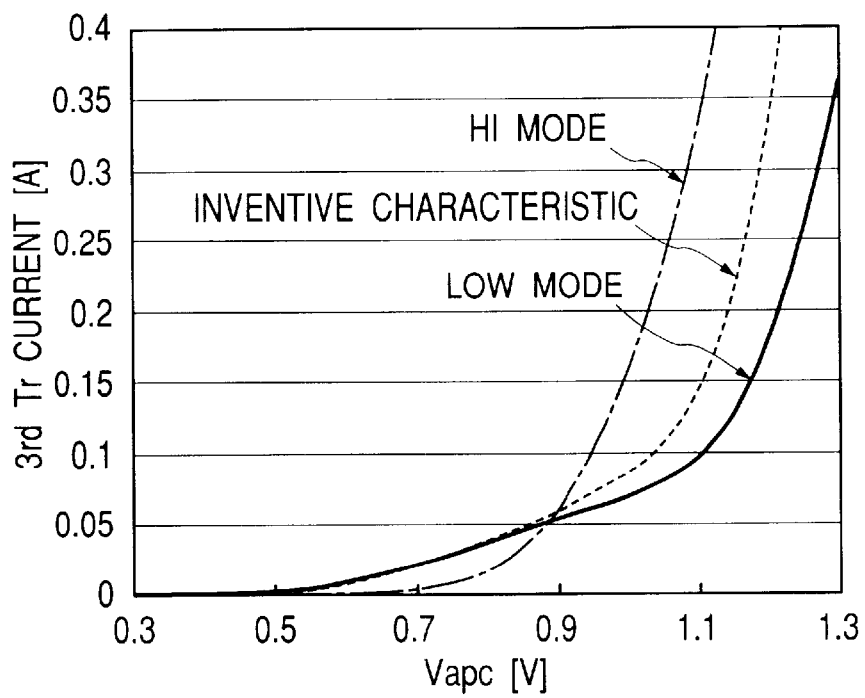
FIG. 3 is a graph showing the correlation between the power control signal Vapc and the gate current of transistor 3rdTr.
Figure 4:
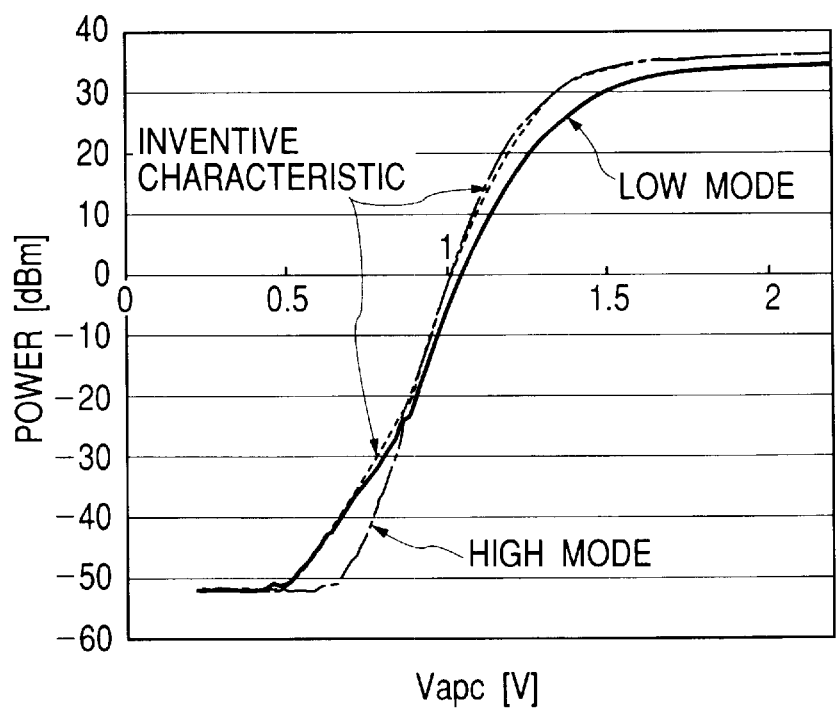
FIG. 4 is a graph showing the correlation between the power control signal Vapc and the output power of the high-frequency power amplifier 20.
Figure 5:
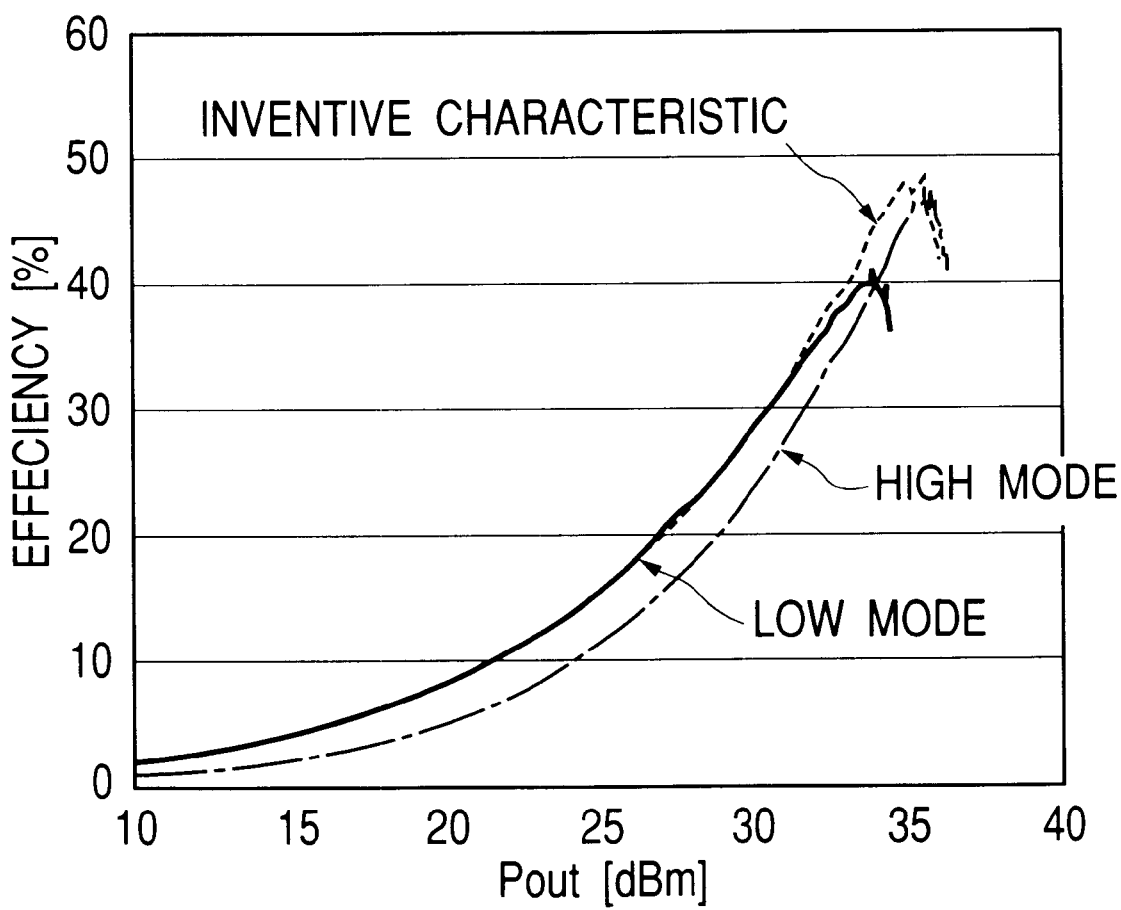
FIG. 5 is a graph showing the correlation between the output power (Pout) and the operational efficiency of the high-frequency power amplifier 20.

FIG. 3 shows by graph the correlation between the current of 3rdTr and the voltage of power control signal Vapc, FIG. 4 shows the correlation between the voltage of power control signal Vapc and the output power of power amplifier 20, and FIG. 5 shows the correlation between the output power and the operational efficiency of the power amplifier 20.

The Vapc is about 1 V for output power of 0 dBm as shown in FIG. 4. The current of 3rdTr at Vapc of 1 V in the conventional high mode is about 250 mA as shown in FIG. 3, whereas the inventive power amplifier reduces the current significantly to about 100 mA, thereby reducing the power consumption.

Although the characteristic curve of the current of 3rdTr in the A region by the inventive power amplifier is below the conventional characteristic curve of the high mode on the graph of FIG. 2, it does not adversely affect the output power, which is close to the conventional characteristic curve of the high mode as shown in FIG. 4. The operational efficiency of the inventive power amplifier is higher than that of the conventional high mode as shown in FIG. 5.

Figure 6:
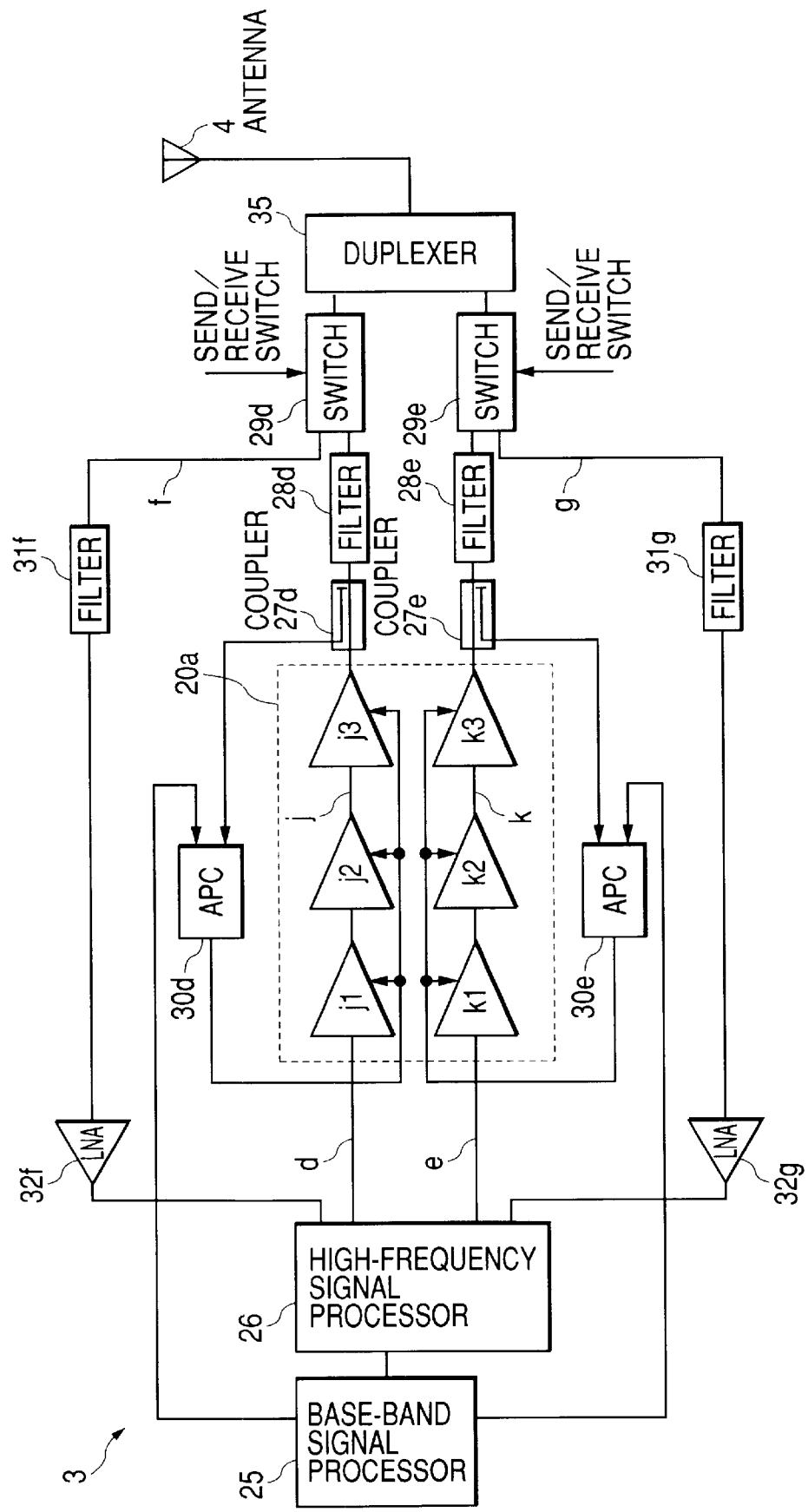
FIG. 6 is a block diagram showing part of the portable telephone unit (mobile terminal unit) which includes a power mode control means as shown in FIG. 1 and a high-frequency power amplifier having two amplifying systems.

FIG. 6 shows by block diagram part of the dual-band portable telephone unit (mobile terminal unit) which includes a power mode control means similar to that of the first embodiment and a high-frequency power amplifier 20a having two amplifying systems. The part of the unit shown in this figure ranges from the base-band processor to the antenna.

The dual-band high-frequency power amplifier 20a has external terminals (not shown), which include input and output terminals for a sending system d, a control terminal for receiving the power control signal Vapc for the power control of three stages j1, j2 and j3 of an amplifying system j, input and output terminals for another sending system e, a control terminal for receiving the power control signal Vapc for the power control of three stages k1, k2 and k3 of another amplifying system k, and power voltage and ground terminals which are common to the amplifying systems j and k.

The amplifying systems j and k have the circuit arrangement shown in FIG. 1, with the amplifying stages j1, j2 and j3 and amplifying stages k1, k2 and k3 being formed of three transistors (1stTr, 2ndTr and 3rdTr).

The portable telephone unit 3 includes a base-band signal processor 25, which is connected to a high-frequency signal processor 26. An antenna 4 is connected to a duplexer 35. Two communication systems (sending system d and receiving system f, and sending system e and receiving system g) for dual-band communication are located between the base-band signal processor 25 and the duplexer 35.

One communication system is made up of the sending system d and receiving system f. The sending system d includes an amplifying system j (amplifying stages j1, j2 and j3) of the dual-band high-frequency power amplifier 20a connected to the high-frequency signal processor 26, a filter 28d connected to the amplifying system j, and a switch 29d connected between the filter 28d and the duplexer 35. A coupler 27d as detection means for measuring the output power of amplifying system j is connected at the output of the amplifying system j. The coupler 27d has its output delivered to an automatic power control circuit (APC) 30d, which also receives a reference signal from the base-band signal processor 25. The APC 30d releases an output of input comparison to the gate electrodes (control electrodes) of the transistors (1stTr, 2ndTr and 3rdTr) of the amplifying stages j1, j2 and j3 of the amplifying system j.

The receiving system f includes a filter 31f connected to the switch 29d, and a low-noise amplifier (LNA) 32f which is connected to the filter 31f and releases its output to the high-frequency signal processor 26.

Another communication system is made up of the sending system e and receiving system g. The sending system e includes an amplifying system k (amplifying stages k1, k2 and k3) of the dual-band high-frequency power amplifier 20a connected to the high-frequency signal processor 26, a filter 28e connected to the amplifying system k, and a switch 29e connected between the filter 28e and the duplexer 35. A coupler 27e as detection means for measuring the output power of amplifying system k is connected at the output of the amplifying system k. The coupler 27e has its output delivered to an automatic power control circuit (APC) 30e, which also receives a reference signal from the base-band signal processor 25. The APC 30e releases an output of input comparison to the gate electrodes (control electrodes) of the transistors (1stTr, 2ndTr and 3rdTr) of the amplifying stages k1, k2 and k3 of the amplifying system k.

The receiving system g includes a filter 319 connected to the switch 29e, and a low-noise amplifier (LNA) 32g which is connected to the filter 31g and releases its output to the high-frequency signal processor 26.

One of the two communication systems is selected for communication by the duplexer 35. Each communication system has its switch 29d or 29e operated for transmission or reception by a send/receive switching signal.

This portable telephone unit has its power mode selected by the bias circuit, instead of using the power control signal from the base station, to have high-power mode for the region (region B) above 29 dBm or have low-power mode for the region (region A) below 29 dBm for example.

Accordingly, in a wireless communication system which avails for wireless communication among wireless communication units by way of a base station, each portable telephone unit is equipped with the foregoing power mode control means, and the base station does not need to transmit a power control signal and can simplify the facility.

The foregoing first embodiment achieves the following effectiveness.

(1) The high-frequency power amplifier 20 has its bias circuit for the last-stage transistor 3rdTr adapted to switch the gate voltage characteristics from nonlinear response to linear response at a power control signal Vapc of about 1.2 V. This switching operation is equivalent to the switching from low-power mode to high-power mode in response to the power control signal from the base station.

(2) In consequence of item (1), the portable telephone unit (wireless communication unit) does not need to have a processor for dealing with the power control signal sent from the base station and thus can reduce the number of component parts. Consequently, the portable telephone unit can be reduced in size and cost.

(3) In contrast to the conventional high-frequency power amplifier, in which the power mode switching circuit is formed by being monolithic on the semiconductor chip of the power amplifier, the inventive high-frequency power amplifier, which is rid of the reception of a remote power control signal (power mode control signal), does not need to include a switching transistor and associated input terminal (pad) on the semiconductor chip and thus can reduce the chip area.

(4) In consequence of item (3), the semiconductor chip of the high-frequency power amplifier can be made much smaller.

(5) In consequence of item (4), the number of semiconductor chips formed on a semiconductor wafer can be increased, the production yield can be improved, and the cost of semiconductor chips can be lowered.

(6) For a wireless communication system in which all portable telephone units are rid of remote power mode switching, the base station does not need to transmit a power control signal and can simplify the facility.

Embodiment 2

Figure 7:
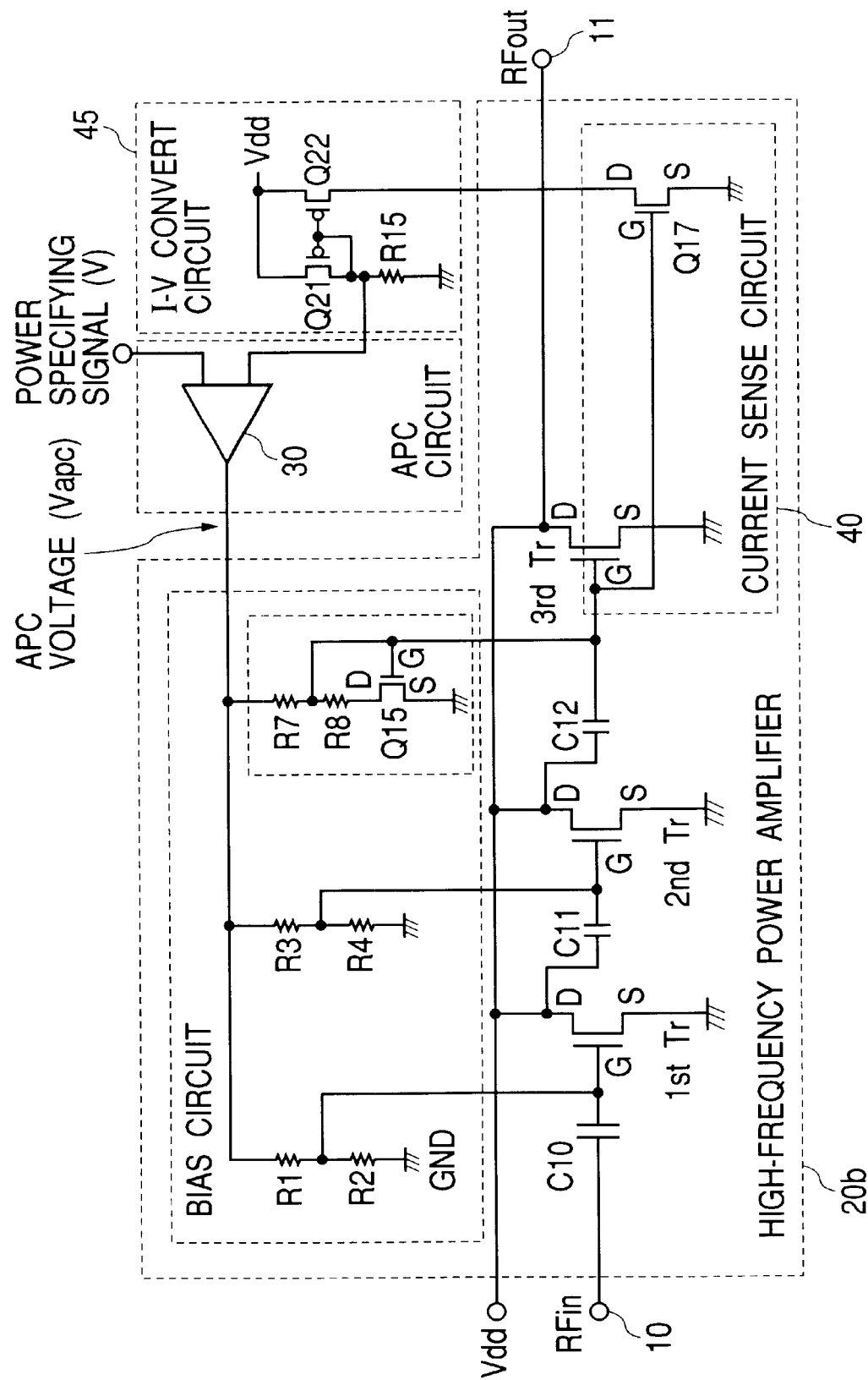
FIG. 7 is an equivalent circuit diagram of the high-frequency power amplifier based-on a second embodiment of this invention.
Figure 8:
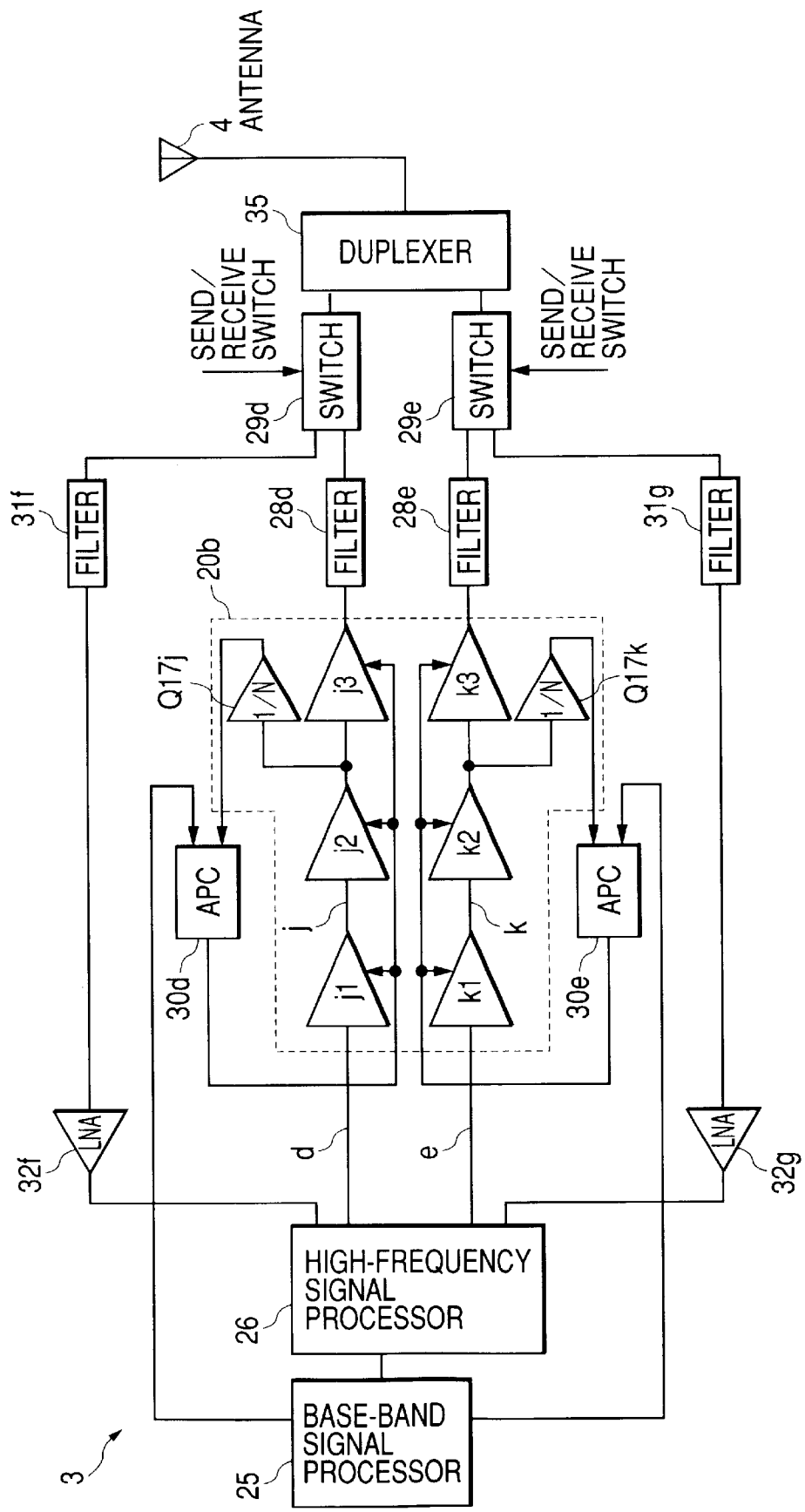
FIG. 8 is a block diagram showing part of the portable telephone unit based on the second embodiment.

FIG. 7 and FIG. 8 are diagrams pertinent to the second embodiment of this invention. This embodiment is derived from the first embodiment, with the former coupler for measuring the output power of the power amplifier being replaced with a different detection means. Specifically, the high-frequency power amplifier (high-frequency circuit module) is different in that a current sensing circuit 40 is added to the power amplifier 20 of the first embodiment.

The current sensing circuit 40 is constituted by the last-stage transistor 3rdTr and a current sensing transistor Q17 which is formed by being monolithic on the semiconductor chip of 3rdTr. The transistor Q17 has its gate electrode connected to the gate electrode of 3rdTr, its drain electrode connected to lead out a detected current to the external output terminal of the power amplifier, and its source electrode grounded. The transistor Q17 has a 1/N size of the 3rdTr. Accordingly, the transistor Q17 has a drain current which correlates with that of 3rdTr.

The portable telephone unit has an automatic power control circuit (APC) 30 shown in FIG. 7. It further includes a current-to-voltage (I–V) conversion circuit 45, which releases a voltage signal to the APC 30, which evaluates the difference of the signal from a power specifying signal and releases a resulting power control signal Vapc.

The I–V conversion circuit 45 is formed of two PMOS transistors Q21 and Q22 in current mirror configuration having their gate electrodes connected together and their drain electrodes connected commonly to the power voltage Vdd, and a resistor R15. The transistor Q22 has its drain electrode connected to the drain electrode of the current sensing transistor Q17. The transistor Q21 has its drain electrode connected to the gate electrode of the transistor Q21 and also to the APC 30, and its source electrode grounded through a resistor R15.

A d.c. signal (bias voltage) and an a.c. signal received by the 3rdTr are also fed to the gate electrode of the current sensing transistor Q17, which then conducts a drain current correspondingly to the 3rdTr. This drain current is converted into a voltage across the resistor R15 in the I–V conversion circuit 45, and it is fed back to the APC 30.

The APC 30 releases a power control signal Vapc, which is responsive to the variation of current of the 3rdTr, to control the multi-stage transistors of the high-frequency power amplifier 20b, thereby accomplishing the same response characteristics as the first embodiment shown in FIG. 2.

FIG. 8 shows by block diagram part of the dual-band portable telephone unit based on this embodiment. This block diagram differs from the block diagram of FIG. 6 in that the couplers are absent, the amplifying systems j and k of the power amplifier 20b are connected directly to the filters 28d and 28e, and the drain currents of the current sensing transistors Q17j and Q17k, which are connected on their gate electrodes to the gate electrodes of 3rdTr of the last amplifying stages j3 and k3 of amplifying systems j and k, are converted into voltages and fed back to the APCs 30d and 30e.

This portable telephone unit 3 can control the output power automatically without using the power control signal sent from the base station, and is capable of performing satisfactory communication while conserving power.

Figure 9A:
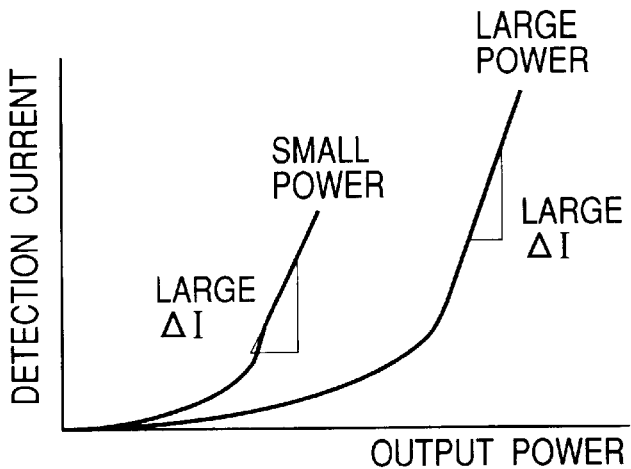
FIGS. 9(a) and 9(b) are characteristic graphs showing the correlation between the output power of 3rdTr and the detection current resulting from different numbers of detectors.
Figure 9B:
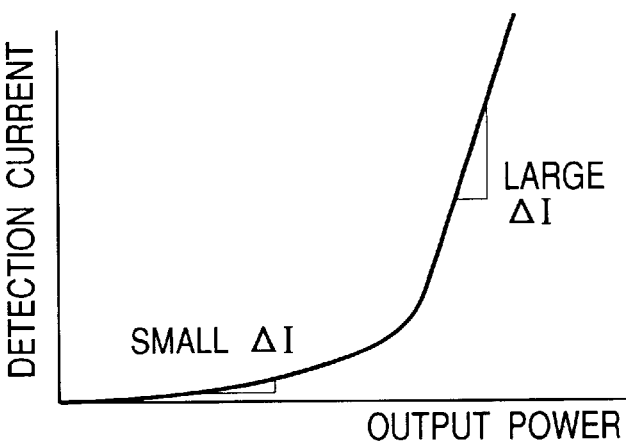

The following describes the result of examination on the current sensing schemes, with reference to FIGS. 9(a) and 9(b) through FIG. 15. FIGS. 9(a) and 9(b) show on characteristic graphs the correlation between the output power of 3rdTr and the detection current resulting from different numbers of detectors. FIG. 9(a) is the case of using two detectors selectively for two power ranges, and FIG. 9(b) is the case of using one detector to measure the output power of 3rdTr.

The scheme of using one of two detectors depending on the power level yields a large current variation (ΔI) per unit power, enabling the accurate measurement of detection current.

Figure 10:
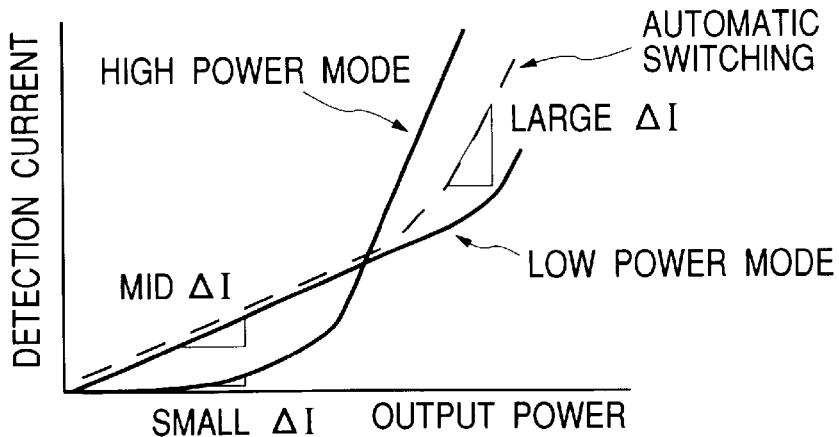
FIG. 10 is a characteristic graph showing the correlation between the output power of 3rdTr and the detection current resulting from the provision of the inventive power mode control means.

The inventive portable telephone unit having a power mode control means achieves the response characteristics which comprehend the two-detector scheme to some extent as shown in FIG. 10. Although the sensitivity of detection in low-power range is not so good as the two-detector scheme, it does not fall sharply and is within the practical range. Consequently, the need of switching the detectors depending on the power level is eliminated.

Figure 11:
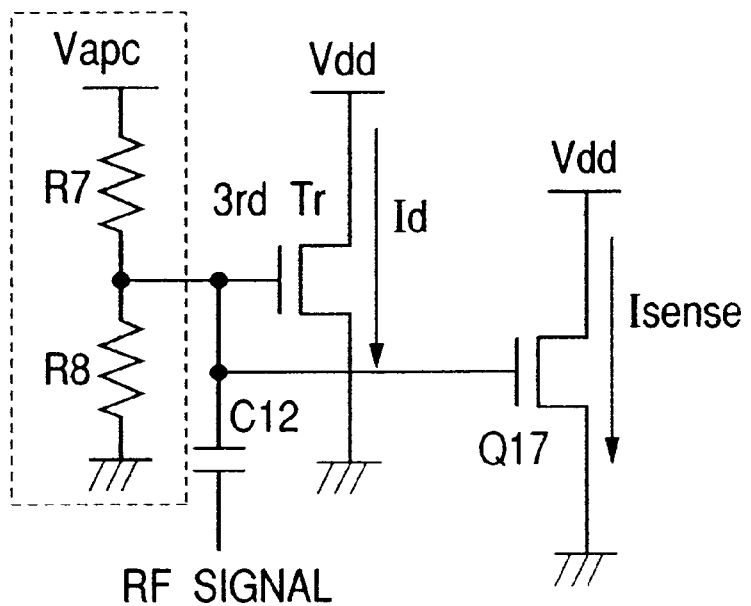
FIG. 11 is an equivalent circuit diagram of the bias circuit section for 3rdTr in high-power mode.

In regard to the disparity of part characteristics, the following compares the conventional unit having high-power mode and low-power mode and the inventive unit based on automatic mode control. In the high-power mode, in which the gate voltage is derived from the Vapc voltage divided by resistors as shown in FIG. 11, a variation of threshold voltage Vth due to the temperature or the like results directly in a variation of drain current Id and thus in a variation of detection current.

Figure 12:
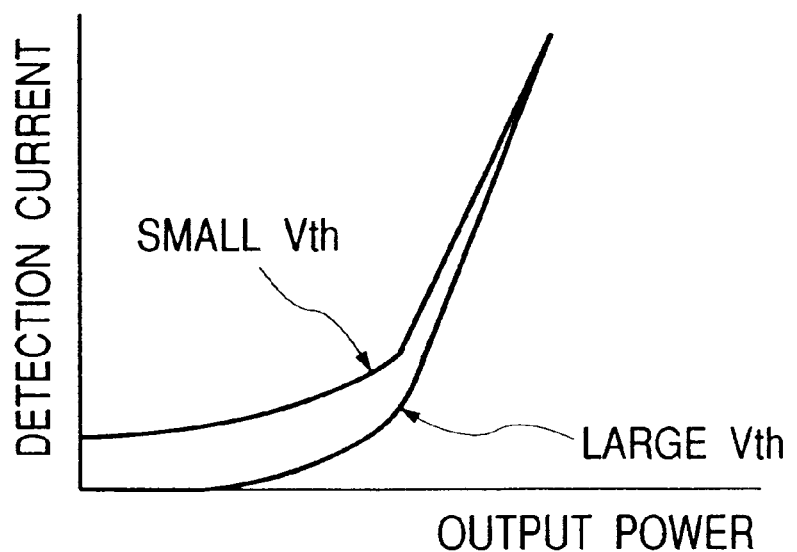
FIG. 12 is a graph showing the variation of detection current caused by the fluctuation of Vth in high-power mode.
Figure 13:
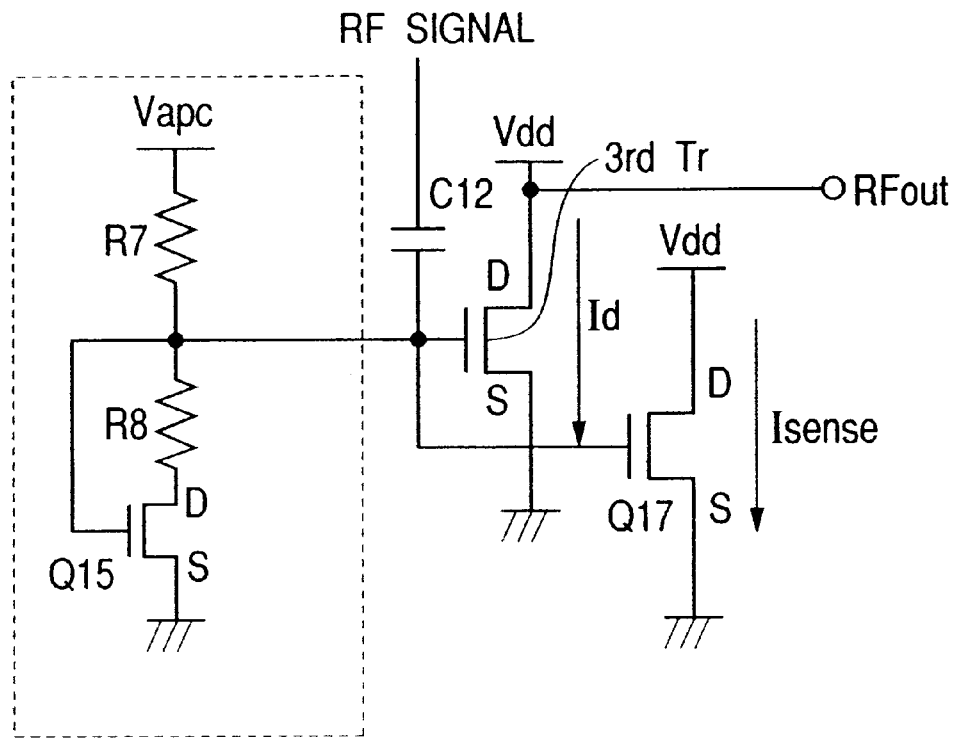
FIG. 13 is an equivalent circuit diagram of the bias circuit section for 3rdTr in low-power mode.

The transistor 3rdTr is saturated at a large output power, and therefore the variation of detection current becomes smaller as shown in FIG. 12. At a small output power, the transistors 3rdTr and Q15 and the current sensing transistor Q17 form a current mirror circuit as shown in FIG. 13, and the transistors 3rdTr and Q17 have their drain currents Id and Isense less affected by the temperature-caused variation of Vth as shown in FIG. 14.

Figure 14:
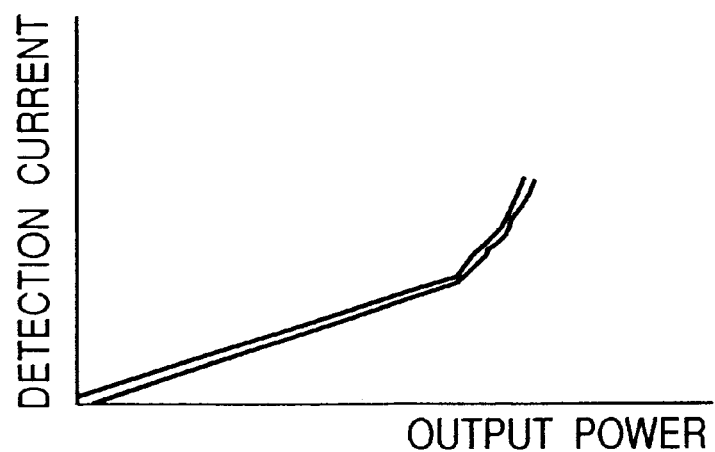
FIG. 14 is a graph showing the variation of detection current caused by the fluctuation of Vth in low-power mode.

FIG. 14 shows the correlation between the output power and the detection current in low-power mode. Two characteristic curves have a small distance from each other, indicating a non-zero variation depending on the value of Vth.

Figure 15:
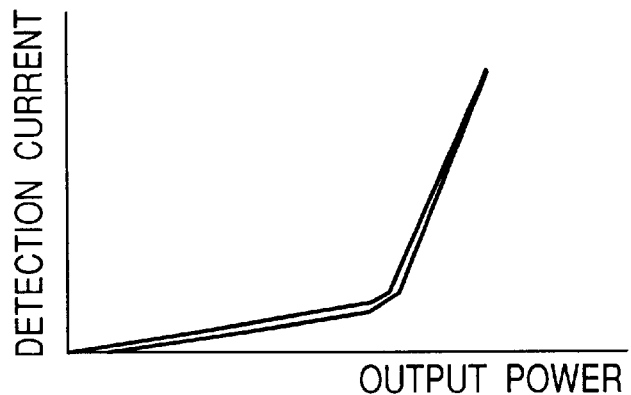
FIG. 15 is a graph showing the variation of detection current caused by the fluctuation of Vth in low-power mode.

FIG. 15 shows the variation of detection current of the case of the inventive automatic mode control. The two characteristic curves indicate a non-zero variation also in this case.

It will be appreciated from the foregoing that the inventive scheme of automatic mode control is immune to the sharp fall of detection sensitivity, and accordingly it can eliminate the need of switching the detectors. In addition, the inventive scheme of automatic mode control makes the variation of 3rdTr drain current Id smaller, and accordingly the variation of drain current Isense of the current sensing transistor Q17 is also smaller.

Figure 16:
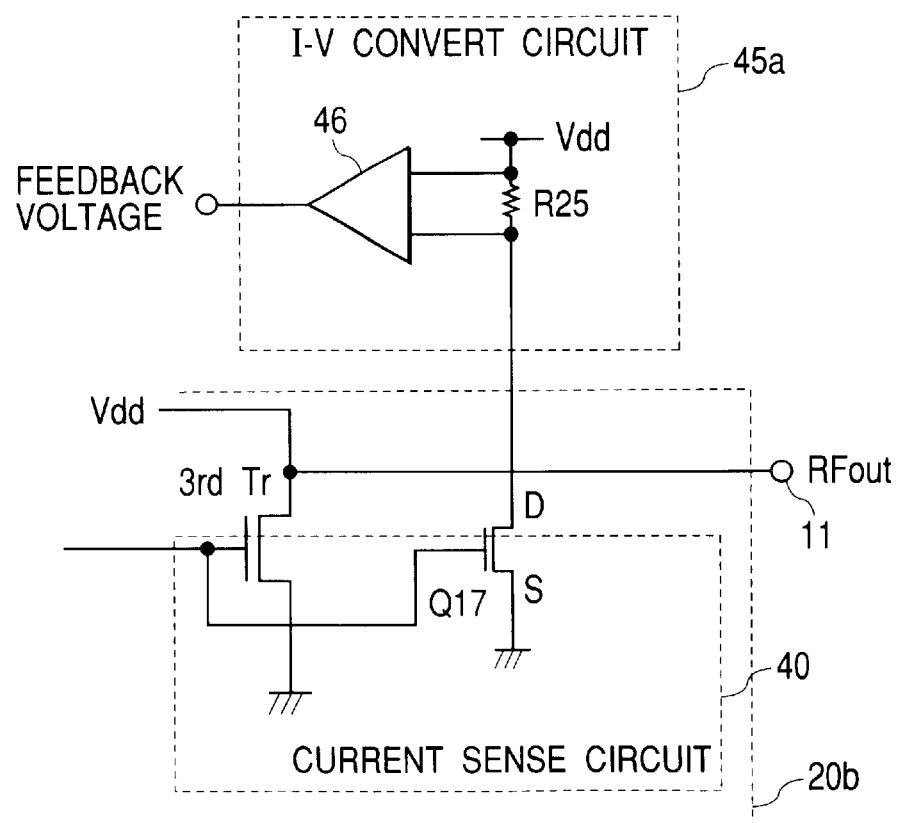
FIG. 16 is a circuit diagram of the I–V conversion circuit section which is a variant of the second embodiment.
Figure 17:
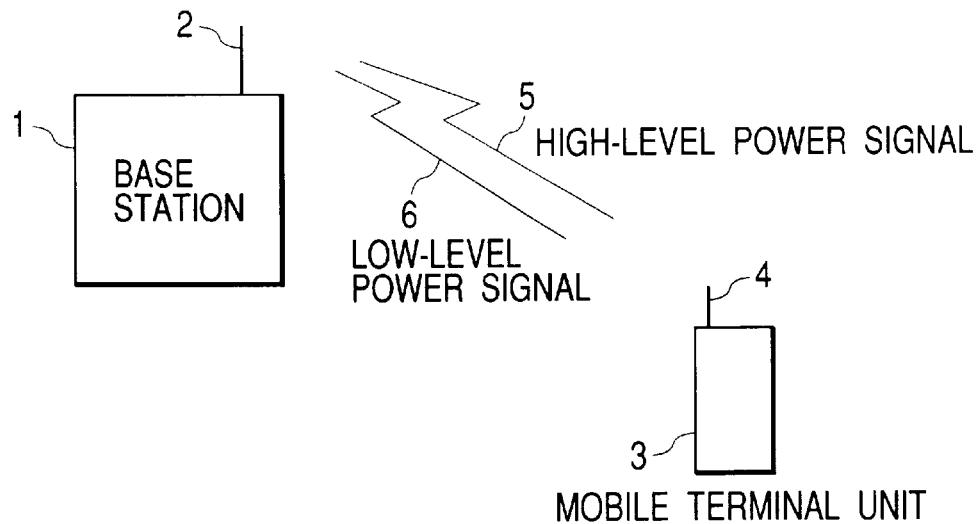
FIG. 17 is a diagram showing an overall wireless communication system including a base station and mobile terminal unit.
Figure 18:
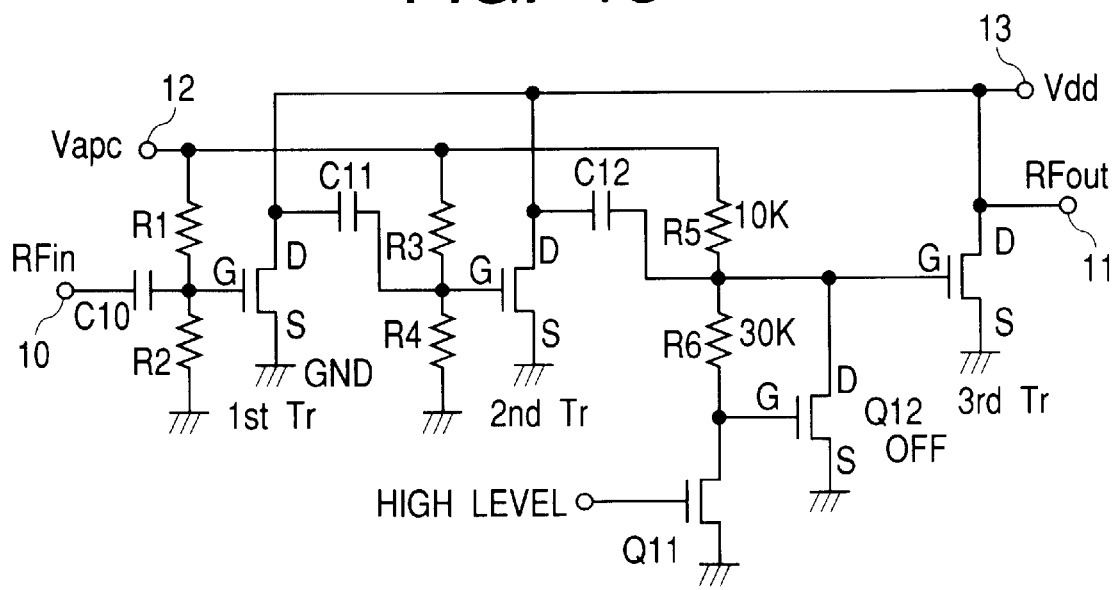
FIG. 18 is an equivalent circuit diagram of a high-frequency power amplifier, with a high-level power signal being fed to the switching transistor.
Figure 19:
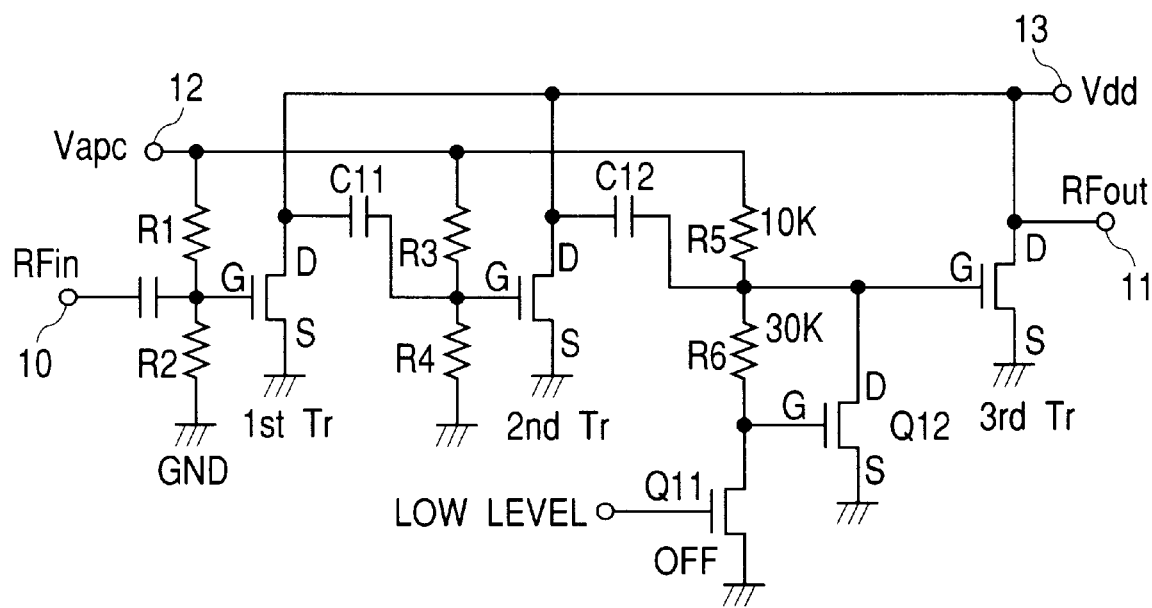
FIG. 19 is an equivalent circuit diagram of a high-frequency power amplifier, with a low-level power signal being fed to the switching transistor.

FIG. 16 shows the I–V conversion circuit section which is a variant of the second embodiment. The I–V conversion circuit 45a is made up of a differential amplifier 46 and a resistor R25 connected between the two input terminals of the amplifier 46. The differential amplifier 46 has its positive input terminal connected to the power voltage Vdd and its negative input terminal connected to the drain electrode of the current sensing transistor Q17. The amplifier 46 releases an output voltage, which is fed back to the APC (not shown).

This variant embodiment performs the automatic mode control, which is equivalent to the switching from low-power mode to high-power mode in response to the power control signal from the base station, in response to the variation of power control signal Vapc, as in the case of the preceding second embodiment.

Although the specific embodiments of the present invention have been explained, the present invention is not confined to these embodiments, but can be altered extensively without departing from the essence of the invention.

For example, field effect transistors used for the amplifying stages of the foregoing embodiments can be replaced with silicon bipolar transistors, SiGeFETs, GaAs-MESFETs, high electron mobility transistors (HEMT), or hetero-bipolar transistors (HBT), while achieving similar effectiveness.

The major effectiveness achieved by the present invention is briefed as follows.

(1) The inventive high-frequency power amplifier and wireless communication apparatus are capable of selecting the high-power mode or low-power mode automatically without using the power control signal sent from the base station. Specifically, the inventive portable telephone unit does not need to have a processor for dealing with the power control signal from the base station and thus can reduce the number of component parts. Accordingly, the inventive portable telephone unit can be reduced in size and cost.

(2) The inventive compact and inexpensive high-frequency power amplifier can control the output power characteristics accurately.

(3) The inventive wireless communication apparatus can control the output power characteristics accurately to perform stable communication.

(4) In the inventive wireless communication system in which all portable telephone units units are rid of remote power mode switching, the base station does not need to transmit a power control signal and can simplify the facility.

What is claimed is:

1. A high-frequency power amplifier, comprising:
    an input terminal;
    an output terminal;
    a control terminal which receives a power control signal;
    an amplifying system which has multiple amplifying stages and is connected between said input terminal and said output terminal; and
    a bias circuit which is connected to said control terminal and adapted to supply a bias voltage, which has a nonlinear response to the power control signal received on said control terminal, to a first amplifying stage connected to said output terminal among said multiple amplifying stages,
    wherein said bias circuit includes:
        a voltage division circuit which divides the voltage of the power control signal and delivers a divided voltage to the control terminal of said first amplifying stage;
        a control transistor having its control electrode connected to the voltage division node of said voltage division circuit, its first electrode connected to the resistor on the lower voltage side relative to the voltage division node of said voltage division circuit, and its second electrode grounded; and
        a current sensing transistor having its control electrode connected to the control electrode of the transistor of said first amplifying stage and releasing from its first electrode a voltage signal indicative of the value of a sensed current.

2. A wireless communication apparatus, comprising:
    a high-frequency power amplifier for transmission;
    detection means for measuring the output power of said power amplifier; and
    a power control circuit which controls the output power of said power amplifier based on information provided by said detection means,
    said power amplifier including:
        an input terminal;
        an output terminal;
        a control terminal which receives a power control signal;
        an amplifying system which has multiple amplifying stages and is connected between said input terminal and said output terminal; and
        a bias circuit which is connected to said control terminal and adapted to supply a bias voltage, which has a nonlinear response to the power control signal received on said control terminal, to a first amplifying stage, which is connected to said output terminal, among said multiple amplifying stages,
    wherein said bias circuit of said high-frequency power amplifier includes:
        a voltage division circuit which divides with multiple resistors the voltage of the power control signal and delivers a divided voltage to the control terminal of said first amplifying stage;
        a control transistor having its control electrode connected to the voltage division node of said voltage division circuit, its first electrode connected to the resistor on the lower voltage side relative to the voltage division node of said voltage division circuit, and its second electrode grounded; and
        a current sensing transistor having its control electrode connected to the control electrode of the transistor of said first amplifying stage and its first electrode releasing a sensed current.

3. A wireless communication system for performing wireless communication among wireless communication apparatus by way of a base station, said base station having no facility of transmitting a power control signal to said wireless communication apparatus, said wireless communication apparatus each having power mode control means for controlling the power mode without using the power control signal,
    wherein said wireless communication apparatus each include:
        a high-frequency power amplifier for transmission;
        detection means for measuring the output power of said power amplifier; and
        a power control circuit which controls the output power of said power amplifier based on information -provided by said detection means,
        said power amplifier including:
            an input terminal;

an output terminal;
a control terminal which receives a power control signal;
an amplifying system which has multiple amplifying stages and is connected between said input terminal and said output terminal; and
a bias circuit which is connected to said control terminal and adapted to supply a bias voltage, which has a nonlinear response to the power control signal received on said control terminal, to a first amplifying stage, which is connected to said output terminal, among said multiple amplifying stages,
said bias circuit constituting said power mode control means.

4. A wireless communication system according to claim 3, wherein said detection means includes a coupler which measures the output power of said high-frequency power amplifier and releases an output signal to said power control circuit.

5. A wireless communication system according to claim 3, wherein said detection means includes a current sensing transistor having its control electrode connected to the control electrode of a transistor included in said first amplifying stage of said high-frequency power amplifier and having its output current converted into a voltage and fed to said power control circuit.

6. A high-frequency power amplifier comprising:
an input terminal;
an output terminal;
a control terminal which receives a power control signal;
an amplifying system which has a plurality of amplifiers and which is coupled between said input terminal and said output terminal; and
a bias circuit which is coupled to said control terminal and to said amplifying system and which includes a first resistance element having a first node and a second node, a second resistance element having a first node coupled to the second node of the first resistance element and a second node, and a first transistor having a gate coupled to the second node of the first resistance element, a first electrode coupled to the control terminal via the first resistance element and the second resistance element, and a second electrode for receiving a predetermined voltage, wherein a voltage according to the power control signal is generated from the second node of the first resistance element, and wherein the bias circuit provides a voltage according to the generated voltage to the amplifying system as a bias voltage without receiving a mode signal for indicating one of a lower power mode in which the high-frequency power amplifier is capable of outputting a lower level than a predetermined value and a high power mode in which the high-frequency power amplifier is capable of outputting a higher level than the predetermined value.

7. A high-frequency power amplifier according to claim 6, wherein the plurality of amplifiers includes a first amplifier having an output node coupled to the output terminal and an input node, and a second amplifier coupled between the input node of the first amplifier and the input terminal, wherein said bias voltage is applied to the first amplifier.

8. A high-frequency power amplifier according to claim 7, wherein the first amplifier includes a second transistor having a gate which is coupled to the input node and to which the bias voltage is applied from the bias circuit and an electrode coupled to the input node.

9. A high-frequency power amplifier according to claim 8, wherein said bias circuit includes a voltage dividing circuit which receives the power control signal and provides a divided power control signal to the second amplifier as a bias voltage.

10. A high-frequency power amplifier according to claim 9, wherein the first electrode of the first transistor is coupled to the second node of the second resistance element, and wherein each of the first transistor and the second transistor is a MOSFET.

11. A high-frequency power amplifier according to claim 10, wherein the generated voltage is applied to the gate of the second transistor as the bias voltage.

12. A high-frequency power amplifier according to claim 9, further comprising:
a third transistor having a gate coupled to the gate of the second transistor; and
a power control signal generating circuit which receives an output signal from the third transistor and a power indicating signal and which generates the power control signal in accordance with difference between the output signal of the third transistor and the power indicating signal.

13. A high-frequency power amplifier according to claim 12, wherein each of the first transistor, the second transistor and the third transistor is a MOSFET, and wherein the output of the third MOSFET corresponds to a current that flows between the drain and source of the first MOSFET.

14. A high-frequency power amplifier comprising:
an input terminal;
an output terminal;
a control terminal which receives a power control signal;
an amplifying system which has a plurality of amplifiers and which is coupled between said input terminal and said output terminal; and
a bias circuit which is coupled to said control terminal and to said amplifying system and which includes a transistor having a gate, a first electrode and a second electrode for receiving a predetermined voltage, and a resistance element having a first node coupled to the gate of the transistor and a second node coupled to the first electrode of the transistor, wherein a voltage according to the power control signal is generated from the first node of the resistance element in response to applying the power control signal to the gate of the transistor, and wherein the bias circuit provides a voltage according to the generated voltage to the amplifying system as a bias voltage without receiving a mode signal for indicating one of a low power mode in which the high-frequency power amplifier is capable of outputting a lower level than a predetermined value and a high power mode in which the high-frequency power amplifier is capable of outputting a higher level than the predetermined value.

15. A high-frequency power amplifier according to claim 14, wherein the plurality of amplifiers includes a first amplifier having an output node coupled to the output terminal and an input node, and a second amplifier coupled between the input node of the first amplifier and the input terminal, wherein said bias voltage is applied to the first amplifier.

16. A high-frequency power amplifier according to claim 15, wherein the first amplifier includes a second transistor having a gate which is coupled to the input node an to which the bias voltage is applied from the bias circuit and an electrode coupled to the output node.

17. A high-frequency power amplifier according to claim 16, wherein said bias circuit includes a voltage dividing circuit which receives the power control signal and provides a divided power control signal to the second amplifier as a bias voltage.

18. A high-frequency power amplifier according to claim 17, wherein each of the first transistor and the second transistor is a MOSFET.

19. A high-frequency power amplifier according to claim 18, wherein the generated voltage is applied to the gate of the second transistor as the bias voltage.

20. A wireless communication apparatus comprising:
a high-frequency power amplifier;
detection means for measuring an output power of the high-frequency power amplifier; and
a power control circuit which controls the output power of the high-frequency power amplifier based on an output of the detection means,
wherein the high-frequency power amplifier comprises:
an input terminal;
an output terminal;
a control terminal which receives a power control signal from the power control circuit;
an amplifying system which has a plurality of amplifiers and which is coupled between said input terminal and said output terminal; and
a bias circuit which is coupled to said control terminal and to said amplifying system and which includes a first resistance element having a first node and a second node, a second resistance element having a first node coupled to the second node of the first resistance element and a second node, and a first transistor having a gate coupled to the second node of the first resistance element, a first electrode coupled to the control terminal via the first resistance element and the second resistance element, and a second electrode for receiving a predetermined voltage, wherein a voltage according to the power control signal is generated from the second node of the first resistance element, and wherein the bias circuit provides a voltage according to the generated voltage to the amplifying system as a bias voltage without receiving a mode signal for indicating one of a low power mode in which the high-frequency power amplifier is capable of outputting a lower level than a predetermined value and a high power mode in which the high-frequency power amplifier is capable of outputting a higher level than the predetermined value.

21. A wireless communication apparatus according to claim 20, wherein the plurality of amplifiers includes a first amplifier having an output node coupled to the output terminal and an input node, and a second amplifier coupled between the input node of the first amplifier and the input terminal, wherein said bias voltage is applied to the first amplifier.

22. A wireless communication apparatus according to claim 21, wherein the first amplifier includes a second transistor having a gate which is coupled to the input node and to which the bias voltage is applied from the bias circuit and an electrode coupled to the output node.

23. A wireless communication apparatus according to claim 22, wherein said bias circuit includes a voltage dividing circuit which receives the power control signal and provides a divided power control signal to the second amplifier as a bias voltage.

24. A wireless communication apparatus according to claim 23, wherein the first electrode of the first transistor is coupled to the second node of the second resistance element, and wherein each of the first transistor and the second transistor is a MOSFET.

25. A wireless communication apparatus according to claim 24, wherein the generated voltage is applied to the gate of the second transistor as the bias voltage.

26. A wireless communication apparatus comprising:
a high-frequency power amplifier;
detection means for measuring an output power of the high-frequency power amplifier; and
a power control circuit which controls the output power of the high-frequency power amplifier based on an output of the detection means,
wherein the high-frequency power amplifier comprises:
an input terminal;
an output terminal;
a control terminal which receives a power control signal from the power control circuit;
an amplifying system which has a plurality of amplifiers and which is coupled between said input terminal and said output terminal; and
a bias circuit which is coupled to said control terminal and to said amplifying system and which includes a transistor having a gate, a first electrode and a second electrode for receiving a predetermined voltage, and a resistance element having a first node coupled to the gate of the transistor and a second node coupled to the first electrode of the transistor, wherein a voltage according to the power control signal is generated from the first node of the resistance element in response to applying the power control signal to the gate of the transistor, and wherein the bias circuit provides a voltage according to the generated voltage to the amplifying system as a bias voltage without receiving a mode signal for indicating one of a low power mode in which the high-frequency power amplifier is capable of outputting a lower level than a predetermined value and a high power mode in which the high-frequency power amplifier is capable of outputting a higher level than the predetermined value.

27. A wireless communication apparatus according to claim 26, wherein the plurality of amplifiers includes a first amplifier having an output node coupled to the output terminal and an input node, and a second amplifier coupled between the input node of the first amplifier and the input terminal, wherein said bias voltage is applied to the first amplifier.

28. A wireless communication apparatus according to claim 27, wherein the first amplifier includes a second transistor having a gate which is coupled to the input node and to which the bias voltage is applied from the bias circuit and an electrode coupled to the output node.

29. A wireless communication apparatus according to claim 28, wherein said bias circuit includes a voltage dividing circuit which receives the power control signal and provides a divided power control signal to the second amplifier as a bias voltage.

30. A wireless communication apparatus according to claim 29, wherein each of the first transistor and the second transistor is a MOSFET.

31. A wireless communication apparatus according to claim 30, wherein the generated voltage is applied to the gate of the second transistor as the bias voltage.

32. A wireless communication system comprising:
a base station and a wireless communication apparatus which performs wireless communication with the base station, wherein the base station has no function for outputting a mode signal which indicates one of a low power mode in which the wireless communication apparatus is capable of outputting a lower level than a predetermined value and a high power mode in which the wireless communication apparatus is capable of outputting a higher level than the predetermined value, and wherein the wireless communication apparatus comprises:
- a power control circuit which provides a power control signal;
- an input terminal;
- an output terminal;
- a control terminal which receives the power control signal;
- an amplifying system which has a plurality of amplifiers and which is coupled between said input terminal and said output terminal; and
- a bias circuit which is coupled to said control terminal and to said amplifying system and which includes a first resistance element having a first node and a second node, a second resistance element having a first node coupled to the second node of the first resistance element and a second node, and a first transistor having a gate coupled to the second node of the first resistance element, a first electrode coupled to the control terminal via the first resistance element and the second resistance element, and a second electrode for receiving a predetermined voltage, wherein a voltage according to the power control signal is generated from the second node of the first resistance element, and wherein the bias circuit provides a voltage according to the generated voltage to the amplifying system as a bias voltage.

33. A wireless communication system, according to claim 32, wherein the plurality of amplifiers includes a first amplifier having an output node coupled to the output terminal and an input node, and a second amplifier coupled between the input node of the first amplifier and the input terminal, wherein said bias voltage is applied to the first amplifier.

34. A wireless communication system according to claim 33, wherein the first amplifier includes a second transistor having a gate which is coupled to the input node and to which the bias voltage is applied from the bias circuit and a first electrode coupled to the output node.

35. A wireless communication system according to claim 34, wherein said bias circuit includes a voltage dividing circuit which receives the power control signal and provides a divided power control signal to the second amplifier as a bias voltage.

36. A wireless communication system according to claim 35, wherein the first electrode of the first transistor is coupled to the second node of the second resistance element, and wherein each of the first transistor and the second transistor is a MOSFET.

37. A wireless communication system according to claim 36, wherein the generated voltage is applied to the gate of the second transistor as the bias voltage.

38. A wireless communication system according to claim 37, wherein the power control circuit includes means for forming the power control signal according to difference between a power indication signal and an output power level of the amplifying system.

39. A wireless communication system according to claim 37, wherein the power control circuit includes means for forming the power control signal according to difference between a power indication signal and a current that flows between the first electrode and a second electrode of the second transistor.

40. A wireless communication system comprising:
a base station and a wireless communication apparatus which performs wireless communication with the base station, wherein the base station has no function for outputting a mode signal which indicates one of a low power mode in which the wireless communication apparatus is capable of outputting a lower level than a predetermined value and a high power mode in which the wireless communication apparatus is capable of outputting a higher level than the predetermined value, and wherein the wireless communication apparatus comprises:
- a power control circuit which provides a power control signal;
- an input terminal;
- an output terminal;
- a control terminal which receives a power control signal from the power control circuit;
- an amplifying system which has a plurality of amplifiers and which is coupled between said input terminal and said output terminal; and
- a bias circuit which is coupled to said control terminal and to said amplifying system and which includes a transistor having a gate, a first electrode and a second electrode for receiving a predetermined voltage, and a resistance element having a first node coupled to the gate of the transistor and a second node coupled to the first electrode of the transistor, wherein a voltage according to the power control signal is generated from the first node of the resistance element in response to applying the power control signal to the gate of the transistor, and wherein the bias circuit provides a voltage according to the generated voltage to the amplifying system as a bias voltage.

41. A wireless communication system according to claim 40, wherein the plurality of amplifiers includes a first amplifier having an output node coupled to the output terminal and an input node, and a second amplifier coupled between the input node of the first amplifier and the input terminal, wherein said bias voltage is applied to the first amplifier.

42. A wireless communication system according to claim 41, wherein the first amplifier includes a second transistor having a gate which is coupled to the input node and to which the bias voltage is applied from the bias circuit and a first electrode coupled to the output node.

43. A wireless communication system according to claim 47, wherein said bias circuit includes a voltage dividing circuit which receives the power control signal and provides a divided power control signal to the second amplifier as a bias voltage.

44. A wireless communication system according to claim 43, wherein each of the first transistor and the second transistor is a MOSFET.

45. A wireless communication system according to claim 44, wherein the generated voltage is applied to the gate of the second transistor as the bias voltage.

46. A wireless communication system according to claim 45, wherein the power control circuit includes means for forming the power control signal according to difference between a power indication signal and an output power level of the amplifying system.

47. A wireless communication system according to claim 46, wherein the power control circuit includes means for forming the power control signal according to difference between a power indication signal and a current that flows between the first electrode and a second electrode of the second transistor.

* * * * *